United States Patent [19]
Torii et al.

[11] 4,152,716
[45] May 1, 1979

[54] VOLTAGE DIVIDING CIRCUIT IN IC STRUCTURE

[75] Inventors: Shuichi Torii, Tokyo; Tamotu Arai, Kodaira, both of Japan

[73] Assignee: Hitachi, Ltd., Japan

[21] Appl. No.: 756,866

[22] Filed: Jan. 4, 1977

[30] Foreign Application Priority Data

Jan. 7, 1976 [JP] Japan .................................... 51-780

[51] Int. Cl.$^2$ .......................................... H01L 27/02
[52] U.S. Cl. .................................. 357/41; 307/296 R; 307/304; 350/332
[58] Field of Search ............... 357/41, 86; 307/296 R, 307/297, 304; 323/1, 22 T; 330/35; 350/332

[56] References Cited

U.S. PATENT DOCUMENTS

| | | | |
|---|---|---|---|
| 3,761,784 | 9/1973 | Jund | 307/304 X |
| 3,913,026 | 10/1975 | Koehler | 307/304 X |
| 3,916,430 | 10/1975 | Heuner et al. | 357/41 |
| 3,946,327 | 3/1976 | Hsu | 307/304 |
| 3,996,482 | 12/1976 | Lockwood | 307/297 X |

OTHER PUBLICATIONS

R. W. Hanna et al., "Single-Supply Voltage Divider for Small Signal Loads", IBM Technical Disclosure Bulletin, vol. 17, No. 3, Aug. 1974 pp. 937-938.

*Primary Examiner*—Stanley D. Miller, Jr.
*Assistant Examiner*—James W. Davie
*Attorney, Agent, or Firm*—Craig & Antonelli

[57] ABSTRACT

A voltage dividing circuit comprises a plurality of series-connected insulated-gate FETs, each having its gate and drain short-circuited with each other and its source and substrate short-circuited with each other. A substrate in which one FET is formed is isolated from another substrate in which another FET is formed.

12 Claims, 9 Drawing Figures

VOLTAGE DIVIDING CIRCUIT IN IC STRUCTURE

The present invention relates in general to a voltage dividing circuit and particularly to a voltage dividing circuit in IC structure comprising a plurality of insulated-gate field-effect transistors (hereinafter referred to as FET).

In a typical example of a hitherto known voltage dividing circuit implemented in a semiconductor integrated circuit (IC) device, diffused resistors are connected in series to provide divided voltage outputs from junctions between the resistors. With such a structure, the circuit requires an extremely large occupation area when a high voltage source has to be used, since it is generally impossible to attain a high resistivity with the diffused resistor. Thus, such a voltage dividing circuit using diffused resistors is not preferred from the viewpoint of the integration density.

With an attempt to overcome the above-described difficulty, there has been proposed a voltage dividing circuit in IC structure which comprises a plurality of enhancement mode FETs formed in a common substrate or in an isolated region in the substrate and connected in series to one another between a voltage source and a reference potential source with the gates thereof being adapted to be supplied with a common potential. The above-mentioned substrate or region is connected with the reference potential source. The divided output voltages are derived from junctions between the series-connected FETs.

In this proposed voltage dividing circuit, however, the series-connected FETs except the FET directly connected with the reference potential source are to have their apparent threshold voltages equal to individual intrinsic threshold voltages plus incremental threshold voltages due to backward biases to the pn junctions between the sources and the substrate (or the region in the substrate) of the FETs. The backward biases are produced by voltage drops across such FETs which are between the reference potential source and the FETs in question. Meanwhile, the threshold voltages of the FETs may be different from one another depending upon their manufacture, which leads to non-uniformity or instability of the divided voltage outputs from the voltage dividing circuit. Thus, the proposed circuit is not satisfactory.

Accordingly, an object of the invention is to provide a voltage dividing circuit in IC structure comprising insulated gate FETs which is free from the disadvantages of the conventional voltage dividing circuits such as described above.

The above and other objects, novel features as well as advantages of the invention will become more apparent from the detailed description of embodiments of the invention taken in conjunction with the accompanying drawings, in which.

Before entering into a detailed description of the invention, a typical example of a hitherto known voltage dividing circuit will be described by referring to FIG. 1 for a better understanding of the invention.

Figure 1:
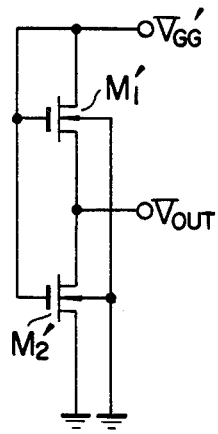
FIG. 1 is a circuit diagram showing a hitherto known voltage dividing circuit by way of example.

In FIG. 1, enhancement mode FETs $M_1'$ and $M_2'$ are connected in series to each other with the gates thereof coupled in common to a source voltage $V_{GG}'$. The substrate common to the FETs $M_1'$ and $M_2'$ is grounded. The divided voltage $V_{out}'$ is derived from the junction between the FETs $M_1'$ and $M_2'$. In such structure of the voltage dividing circuit, since the substrate of the FET $M_1'$ is grounded, the source thereof is given a certain potential relative to the substrate by a voltage drop across the FET $M_2'$. As a result, the apparent threshold voltage between the gate and the source of the FET $M_1'$ amounts to the threshold voltage $V_{thi}$ (the intrinsic threshold voltage) of the FET $M_1'$ plus the voltage difference ($\Delta V_{th}$) between the substrate and the source of the FET $M_1'$. This voltage difference $\Delta V_{th}$ will be referred to as an incremental threshold voltage. Meanwhile, it is possible that the threshold voltage of the FET $M_2'$ is not always identical due to manufacturing conditions which cannot be the same. Accordingly, the incremental threshold voltage for the FET $M_1'$ may be different from one voltage dividing circuit to another, which means that the divided voltage $V_{out}'$ is also different among voltage dividing circuits of the same circuit construction. The reproducibility of the voltage dividing circuit is very poor and it is impossible to employ such voltage dividing circuits in a circuit requiring stabilized divided voltages.

Figure 2:
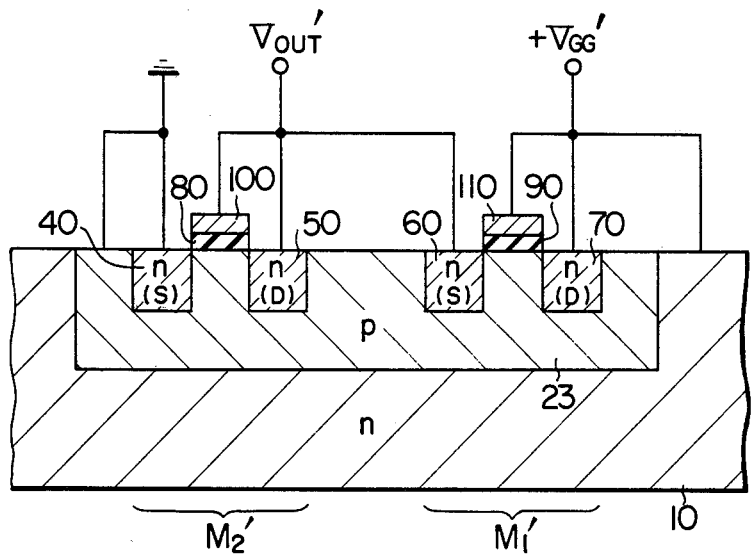
FIG. 2 is a sectional view of the IC structure of the circuit shown in FIG. 1.

In FIG. 2 showing in cross section the IC structure of the circuit of FIG. 1, the same reference numerals or characters denote the corresponding parts of the circuit. The FETs $M_1'$ and $M_2'$ are formed in a common substrate region or in an island 23, which is formed in a substrate or in a wafer 10 having the conductivity type opposite to that of the island 23. The FET $M_1'$ includes source and drain regions 40 and 50 of n-type and a gate 100 formed between the source and drain regions over the substrate region with an insulating layer 80 interposed therebetween. The FET $M_2'$ includes source and drain regions 60 and 70 of n-type and a gate 110 formed between the source and drain regions over the substrate region with an insulating layer 90 interposed therebetween. The common substrate region 23 is, as mentioned in connection with FIG. 1, grounded.

Now, an embodiment of the invention will be described with reference to FIG. 3.

In the circuit arrangement shown in this figure, two enhancement mode n-channel FETs $M_1$ and $M_2$ are connected in series to each other between a voltage source terminal $V_{GG}$ and a grounded terminal. It is to be noted that, in each of these FETs, the gate is short-circuited to the drain, while the source is short-circuited to the substrate. The divided voltage output $V_{out}$ is derived from the junction between the series-connected FETs $M_1$ and $M_2$.

Figure 3:
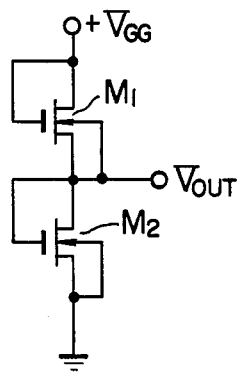
FIG. 3 is a circuit diagram showing a voltage dividing circuit in accordance with an embodiment of the invention.
Figure 4:
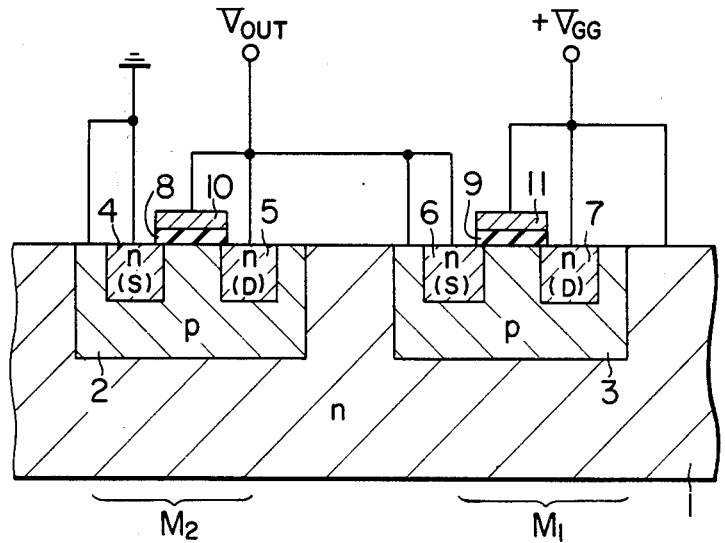
FIG. 4 is a sectional view of the IC structure of the circuit shown in FIG. 3.

FIG. 4 shows in sectional view the IC structure in which the voltage dividing circuit shown in FIG. 3 is implemented. In a wafer 1 of n-type semiconductor material, there are formed two well regions 2 and 3 of p-conductivity type, one of which well region, the region 2 in the illustrated embodiment, is utilized as the substrate for the FET $M_2$, while the other well region 3 is used as the substrate for FET $M_1$. Diffused layers of n-conductivity type 4, 5 and 6, 7 are formed in the substrate regions 2 and 3, respectively. The diffused layers 4 and 5 in the substrate region 2 are used as the source (S) and the drain (D) of the FET $M_2$ while the diffused layers 6 and 7 in the substrate region 3 are used as the source (S) and the drain (D) of the FET $M_1$, respectively. A gate 10 for the FET $M_2$ is formed between the regions 4 and 5 over the surface of the substrate region 2 with an insulating layer 8 interposed between the substrate region 2 and the gate 10. In a similar manner, a gate 17 for the FET $M_2$ is formed between the regions 6 and 7 over the surface of the substrate region 3 with an insulating layer 9 interposed between the substrate region 3 and the gate 11. Subsequently, electrodes and wiring are provided so as to constitute the circuit configuration shown in FIG. 3.

As is apparent from FIG. 4, FETs $M_1$ and $M_2$ are formed in individual well (substrate) regions 2 and 3 which are subjected to backward biases or pn junction isolation, so that the FETs $M_1$ and $M_2$ in the wafer 1 are electrically isolated from each other. Thus, each of the FETs $M_1$ and $M_2$ are not affected by the potential of the semiconductor wafer 1. Further, the source regions 4 and 6 of FETs $M_1$ and $M_2$ are short-circuited to the respective substrate regions 2 and 3 to make the potentials on the source and the substrate regions 6 and 3 identical and the potentials of the source and the substrate regions 4 and 2 identical. Thus, the threshold voltages of the FETs $M_1$ and $M_2$ do not suffer from undesirable influences of the incremental threshold voltage $\Delta V_{th}$ due to potential differences between the substrate regions and the source regions of the FETs $M_1$ and $M_2$. As a result, the equivalent resistances of the FETs $M_1$ and $M_2$ determined by their threshold voltages are not influenced by the incremental threshold voltage $\Delta V_{th}$ produced by the potential difference between the source and substrate regions of each FET.

As will be appreciated from the foregoing description, it is possible to consistently obtain a stable divided voltage output from the voltage dividing circuit according to the invention without being influenced by the incremental threshold voltage $\Delta V_{th}$ which is produced by a source-to-substrate potential difference. By selecting the ratios (W/L) between the channel width W and the channel length L in both of the FETs to be the same to make their threshold voltages, hence their equivalent resistances the same, a divided voltage available from the dividing circuit shown in FIG. 3 will exactly conform to $V_{GG}/2$ (one-half of the voltage on the voltage source terminal).

Moreover, because FETs $M_1$ and $M_2$ may be implemented in the same form through the same process, the voltage dividing circuit according to the invention is suited to be manufactured on a mass-production base with a high yield, enjoying the advantage of the uniform output voltages in the individual voltage dividing circuits, even if non-uniformity exists in the threshold voltage among produced voltage dividing circuits. This is because such non-uniformity, if any, will be present in the same direction at the same ratio in one and the same voltage dividing circuit since there exists no incremental threshold voltage $\Delta V_{th}$ stemming from the souce-to-substrate potential difference.

The voltage dividing circuit according to the invention may be advantageously employed in a high voltage power source circuit, since the voltage dividing circuit is free from the incremental threshold voltage $\Delta V_{th}$ stemming from the source-to-substrate potential difference.

The invention is never restricted to the above described embodiment but can be realized in various configurations. For example, in place of the enhancement mode n-channel FETs described above, p-channel FETs may be equally implemented with the polarity of the voltage source being inversed. Further, the voltage dividing circuit may be realized with depletion mode FETs.

Figure 5:
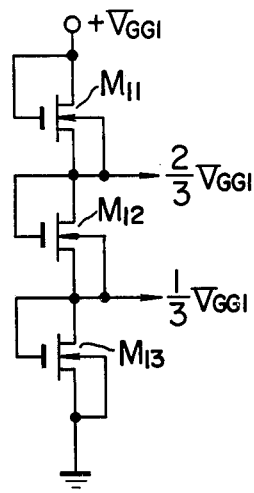
FIG. 5 is a circuit diagram showing another embodiment of the voltage dividing circuit according to the invention.

While two FETs are used in the above described embodiment to produce an output voltage equal to a half of the source voltage, the invention can be applied to such a voltage dividing circuit which comprises three FETs $M_{11}$, $M_{12}$ and $M_{13}$ connected in series to produce divided outputs corresponding to $\frac{2}{3}V_{GG1}$ and $\frac{1}{3}V_{GG1}$, respectively, as shown in FIG. 5. Of course, more than three FETs may be employed to produce a larger number of the divided voltages.

The voltage dividing circuit according to the invention can be advantageously employed for driving a liquid crystal display device. Liquid crystal elements have been widely employed in many display devices such as those for battery-operated electronic desk computers by virtue of their low power consumption property. In order that the liquid crystal elements may enjoy an elongated service life, it is required to drive the elements with a bidirectional voltage, i.e. with an a.c. voltage. It is known that the liquid crystal elements are, when supplied with a d.c. voltage, polarized, resulting in a remarkable reduction of their service life. In this connection, it is also known that, when segments of numerals, or characters each constituted by liquid crystal elements are selectively driven bidirectionally for a display, the non-selected segments may possibly undergo visual changes due to voltages existent between the selected and the nonselected segments. With a view to preventing such visual changes, liquid crystal elements having a visual threshold voltage are employed and the selective drive is carried out in such a manner that the nonselected elements are also supplied with bidirectional voltage lower than the visual threshold voltage. FIGS. 6a-6d illustrate graphically the waveforms of drive voltages which can be utilized in the above application.

Figures 6A, 6B:
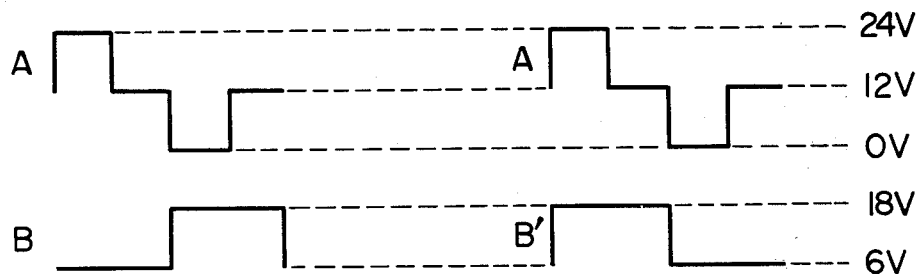
FIGS. 6a-6d graphically show waveforms of drive voltages for a liquid crystal display device which can be produced by a voltage dividing circuit according to the invention.
Figures 6C, 6D:
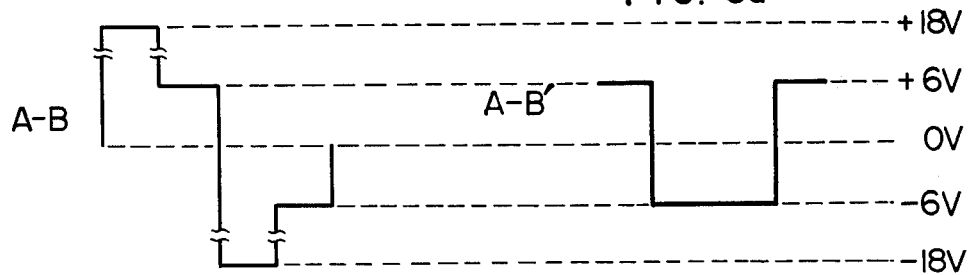

As can be seen from FIG. 6a, a digit signal A is a ternary signal having three levels of 24V, 12V and 0V, while a segment signal B is a binary signal having two levels of 18V and 6V. When a liquid crystal element is driven by the combined signal (A–B) shown in FIG. 6c, the element will undergo a visual change during the first and fourth quarter periods since it is supplied with 18V in absolute value which is larger than the visual threshold value, while during the second and third quarter periods, no visual change occurs since the liquid crystal element is supplied with 6V in absolute value which is smaller than the visual threshold level of the element. The signal wave (A–B) shown in FIG. 6c is for application to selected liquid crystal elements. On the other hand, when a combined signal (A–B′) shown in FIG. 6d wherein B′, shown in FIG. 6b, represents a phase-inverted version of the segment signal B is employed for non-selected segments, the liquid crystal elements constituting the non-selected segments are supplied with bidirectional voltages of ±6V and thus produce no visual change.

In the above described drive system, the utilized voltage levels of 24V, 12V, 18V and 6V have heretofore been produced exteriorly of or separately from an IC device. However, by the use of the voltage dividing circuit according to the invention, such voltages can be produced in or within an IC device, whereby the number of connection leads can be decreased with the integration density of the whole circuit being correspondingly enhanced.

Of course, the voltage dividing circuit can be widely used as an independent voltage dividing circuit in addition to the one integrated in IC structure together with other circuits or elements.

We claim:

1. A voltage dividing circuit in IC structure for dividing DC power source voltages comprising a plurality of series-connected insulated gate FETs formed in individual substrate regions isolated from one another in a semiconductor wafer, each of said FETs having its gate short-circuited with its drain and having its source short-circuited with its substrate region wherein uniform divided DC power voltage is derived from a junction between two adjacent FETs, said uniform divided DC voltage being determined by equivalent resistance ratio of said series-connected FETs.

2. A voltage dividing circuit for dividing DC power source voltages comprising a semiconductor wafer of a first conductivity type having a major surface, a plurality of substrate regions of a second conductivity type formed in the major surface of said wafer, a drain region and a source region formed in each of said substrate region, and a gate conductor formed between the drain and source regions with an insulating film between each substrate region and the said gate conductor, thereby constituting a plurality of insulated-gate FETs in said wafer, said FETS being electrically connected in series, each of said FETs having its gate conductor short-circuited with its drain region and having its source region short-circuited with its substrate region, wherein the drain region of the FET at one end of said series-connected FETs is connected to a power source terminal, the source region of the FET at the other end of said series-connected FETs is connected to a reference potential terminal, and an output terminal is connected to a juncture between two adjacent FETs, and wherein a uniform divided DC voltage is obtained at said output terminal, said uniform divided DC voltage being exclusively determined by equivalent resistance ratio of said series-connected FETs.

3. A voltage dividing circuit for dividing DC power source voltages comprising:
a plurality N of impedance elements connected in series between first and second terminals, wherein each of said impedance elements comprises a field-effect transistor having a source and a substrate connected in common with each other, and a gate and a drain connected in common with each other, and
at least one output terminal being connected to a predetermined juncture between two adjacent impedance elements, wherein a divided voltage having a uniform DC voltage is obtained at said output terminal, said divided voltage being exclusively determined by equivalent resistance ratio of said series-connected impedance elements.

4. A voltage dividing circuit according to claim 3, wherein each of said plurality N of impedance elements comprises a respective enhancement mode field-effect transistor having a source and a substrate connected in common with each other, and a gate and a drain connected in common with each other.

5. A voltage dividing circuit according to claim 3, wherein said plurality N of impedance elements comprises first and second field-effect transistors, and wherein the commonly connected source and substrate of said first field-effect transistor are connected to said first terminal, and the commonly connected gate and drain of said second field-effect transistor are connected to said second terminal.

6. A voltage dividing circuit according to claim 5, wherein the commonly connected source and substrate of said second field-effect transistor are connected in common with the commonly connected drain and gate of said first field-effect transistor.

7. A voltage dividing circuit according to claim 3, wherein a first field-effect transistor of said plurality has its commonly connected source and substrate connected to said first terminal, and the commonly connected gate and drain of the $N^{th}$ field-effect transistor are connected to aid second terminal.

8. A voltage dividing circuit according to claim 7, wherein the commonly connected source and substrate of a $j^{th}$ field-effect transistor are connected in common to the commonly connected drain and gate of a $(j-1)^{th}$ field-effect transistor, where $2 \leq j \leq N$.

9. A voltage dividing circuit in a semiconductor integrated circuit structure for dividing DC power source voltages comprising a plurality of series-connected enhancement-mode insulated-gate FETs connected between a power source terminal and a reference potential terminal and formed in individual substrate regions of one conductivity type, which are individually defined by p-n junctions with a semiconductor wafer having a conductivity type opposite to said substrate regions, isolated from one another in said semiconductor wafer, each of said FETs having its gate short-circuited with its drain and having its source short-circuited with its substrate region, and an output terminal connected to at least one junction between said adjacent FETs for deriving a divided voltage having a uniform DC voltage being exclusively determined by equivalent resistance ratio of said series-connected FETs.

10. A voltage dividing circuit for dividing DC power source voltages comprising a semiconductor wafer of a first conductivity type having a major surface, a plurality of substrate regions of a second conductivity type opposite to said first conductivity type formed in the major surface of said wafer and isolated from one another by PN junctions with the adjacent semiconductor wafer, a drain region and a source region formed in each of said substrate regions, and a gate conductor formed between the drain and source regions with an insulating film between each substrate region and the said gate conductor, thereby constituting a plurality of enchancement-mode insulated-gate FETs in said wafer, and said plurality of said insulated-gate FETs being electrically connected in series between two different voltage source terminals, each of said FETs having its gate conductor short-circuited with its drain region and having its source region short-circuited with its substrate region, and an output terminal connected to at least one junction between said adjacent FETs for deriving a divided voltage having a uniform DC voltage being exclusively determined by equivalent resistance ratio of said series-connected FETs.

11. A voltage dividing circuit structure for dividing DC power source voltages comprising:
- a semiconductor wafer of a first conductivity type having a major surface;
- a plurality of well regions of a second conductivity type opposite to said first conductivity type formed in the major surface of said semiconductor wafer and electrically isolated from one another by PN junction with the adjacent semiconductor material of the wafer;
- a plurality of enhancement-mode insulated-gate FETs disposed in respective ones of said plural well regions, each of said FETs including spaced source and drain regions of the first conductivity type formed within the major surface of said well region, and a gate electrode separated by a gate insulator from the major surface of said well region between said source and drain regions;
- first conductive means for connecting the respective gate electrodes of said plural FETs to their respective drain regions;
- second conductive means for connecting the respective well regions to the respective source regions formed therein;
- third conductive means for connecting the drain region of one of said FETs to the source region of another thereof to electrically connect said plural FETs in series;
- a reference potential terminal connected to the source region of the FET at one end of said semiconductor FETs and a power source terminal connected to the drain region of the FET at the other end of said series-connected FETs respectively; and
- an output terminal connected to at least one juncture between the adjacent FETs of said series-connected FETs for deriving a divided voltage having a uniform DC voltage being exclusively determined by equivalent resistance ratio of said series-connected FETs.

12. A voltage dividing circuit structure according to claim 11, wherein said semiconductor wafer is electrically connected to the drain region of the FET at said other end of the series-connected FETS.

* * * * *